United States Patent [19]

Mohsen

[11] 4,007,381
[45] Feb. 8, 1977

[54] BALANCED REGENERATIVE CHARGE DETECTION CIRCUIT FOR SEMICONDUCTOR CHARGE TRANSFER DEVICES

[75] Inventor: Amr Mohamed Mohsen, North Plainfield, N.J.

[73] Assignee: Bell Telephone Laboratories, Incorporated, Murray Hill, N.J.

[22] Filed: Apr. 18, 1975

[21] Appl. No.: 569,581

[52] U.S. Cl. .................. 307/235 F; 307/221 D; 307/235 T; 307/DIG. 3; 357/24
[51] Int. Cl.[2] ............ H03K 5/20; H03K 3/353; G11C 19/28; H01L 27/10
[58] Field of Search ...... 307/221 C, 221 D, DIG. 3, 307/304, 235 F, 235 T; 357/24

[56] References Cited
UNITED STATES PATENTS

| | | | |
|---|---|---|---|
| 3,758,794 | 9/1973 | Kosonocky | 307/304 |
| 3,760,381 | 9/1973 | Yao | 307/DIG. 3 X |
| 3,806,898 | 4/1974 | Askin | 307/DIG. 3 X |
| 3,881,117 | 4/1975 | Tompsett | 307/221 D |
| 3,891,977 | 6/1975 | Amelio et al. | 357/24 X |
| 3,892,984 | 7/1975 | Stein | 307/DIG. 3 X |

*Primary Examiner*—John S. Heyman
*Assistant Examiner*—Larry N. Anagnos
*Attorney, Agent, or Firm*—D. Caplan

[57] ABSTRACT

In order to use a flip-flop amplifier for regenerative sensing of the binary output stream of a many-stage main semiconductor charge transfer device section, an auxiliary semiconductor charge transfer device section of but a few or a single transfer stage is fabricated in close proximity of the output diode of the main semiconductor charge transfer device section. This auxiliary charge transfer device section is arranged to provide an output stream of unilevel charge packets which are midway between the binary charge levels of the output stream in the main semiconductor charge transfer device section. By means of preamplifiers which sense these output streams from the main and the auxiliary charge transfer device sections, a gated flip-flop detector can be fed by the preamplifier in such a way that the gated flip-flop detector flips into one or the other of its states depending upon whether the instantaneous level in the main charge transfer device section is greater or less than that of the auxiliary charge transfer device section. Thus, the output of the flip-flop amplifier is representative of the instantaneous binary level of information output of the main semiconductor charge transfer device, and this output of the flip-flop amplifier can then be fed to a buffer amplifier whose output is useful as input for further circulation in the main charge transfer device section.

8 Claims, 4 Drawing Figures

> 4,007,381

BALANCED REGENERATIVE CHARGE DETECTION CIRCUIT FOR SEMICONDUCTOR CHARGE TRANSFER DEVICES

FIELD OF THE INVENTION

This invention relates to the field of semiconductor apparatus and more particularly to detectors of the output of semiconductor charge transfer devices.

BACKGROUND OF THE INVENTION

Semiconductor charge transfer devices, particularly charge coupled device (CCD) type, are becoming of increasing commercial importance as shift register devices. One type of such charge transfer device is operated for the purpose of transferring binary digital bits of information in the form of charge packets by sequential shifting from an input to an output terminal of the device through a sequence of charge transfer stages, in a binary shift register type manner. Each stage is defined by one or more electrodes located on the surface of an insulator layer on a major surface of a semiconductor wafer substrate. There are as many such electrodes associated with each such stage as there are phases in the clock pulse voltage lines driving these electrodes, as known in the art. However, upon transfer through a section of many charge transfer stages in such devices, the binary levels of the charge packets tend to become degraded; that is, a full packet representative of a digital "1", instead of remaining as a full packet, tends to become significantly less than a full packet, whereas digital "0" tends to become significantly more than an "empty" packet. It should be understood of course that by an "empty" packet is meant to include a so-called "fat zero" packet, that is, a packet for representing the binary 0 level which contains from about 5 to 25 percent of a full packet, which is useful in order to keep the traps in the semiconductor filled by means of the charges in the "fat zero" packet. For these traps, if not kept filled, would otherwise eat up and degrade the charges in the packets associated with a binary digital 1 (full cell). In any event after a relatively large number, of the order of 100, of transfers of a charge packet in a section of a semiconductor charge coupled device in the present-day state of the art, it is desirable to have a detection means for discriminating between $Q_1$ vs. $Q_0$ charge packets; that is, those charge packets $Q_1$ arriving at the output terminal with charge content levels above a midpoint level, which is substantially midway between the ideal digital 0 charge content level and the ideal digital 1 charge content level, vs. those packets $Q_0$ arriving with charge content levels below such midlevel. Such kind of detection is commonly known as "regenerative" charge detection, for the purpose of restoring each charge packet level to its original binary 0 or 1 level and feeding it back for further transfer through the same or another section of the charge transfer device. In such a regenerative detection, it would be desirable to be able to use a flip-flop detector amplifier which seems ideal for such a purpose of detecting and amplifying binary levelled signals. For a flip-flop has the capability of magnifying a small initial voltage imbalance to a much larger voltage imbalance. However, such a flip-flop amplifier cannot be directly responsive to the output of a semiconductor transfer device except by comparing it to some other level which is ordinarily not available without taking up large amounts of semiconductor substrate area. Moreover, the input capacitance of an ordinary flip-flop amplifier is inordinately large in comparison with the capacitance of the output diode of the charge transfer device, thereby posing a serious capacitance matching problem.

SUMMARY OF THE INVENTION

An auxiliary charge transfer device section, of but one or a few transfer stages, provides an output signal stream of charge packets which is advantageously at a digital "½" level, that is, midway between the output binary 0 and the binary 1 levels of the output charge packets of a main charge transfer device section, typically of many transfer stages. The output streams of signal charges arriving at both the main and auxiliary charge transfer device sections are fed through individual preamplifiers in a balanced preamplifier configuration for application to a gated flip-flop detector amplifier. The preamplifiers are preset once every cycle of the clocks controlling both the auxiliary and the main transfer device sections, in such a way that when the resulting voltage signals from the output terminals of the preamplifiers are being fed to the flip-flop amplifier, each input insulated gate field effect transistor (IGFET) in the preamplifier at that time has a depleted semiconductor region underneath its gate electrode between source and drain regions. Thereby, the input preamplifier capacitance experienced by the charge packets being delivered to the preamplifier from the semiconductor charge transfer device sections corresponds to the relatively small gate capacitance associated with a depleted channel in an IGFET rather than the relatively large gate capacitance associated with a highly conductive surface channel region between source and drain in the IGFET. The difference in charge packet content (1 or 0) between the binary level charge packets arriving at the output end of the main charge transfer device section and the unilevel charge packets arriving at the output end of the auxiliary charge transfer device section is thus converted into a voltage difference between the output terminals of the balanced preamplifier, and this voltage difference is sampled by the gated flip-flop detector amplifier. The flip-flop is then turned "on" for latching onto this voltage difference, and thereby the voltage imbalance in the flip-flop grows rapidly to an equilibrium flip-flop state representative of this voltage difference. The flip-flop state is then sampled by a buffer amplifier which then drives an output capacitance of typically large value associated with the desired output device section. The balanced detection also reduces the problems associated with clock noise in the lines which drive the charge transfers in the device, as well as problems stemming from threshold voltage variation in the device.

In a specific embodiment of the invention, a main multi-stage semiconductor charge transfer device section is in the form of a three-phase silicon semiconductor charge coupled device (CCD) section feeding a stream of output binary level charge packets to an output diode region. The output diode region is periodically preset, once every cycle of the three-phase clocks, during a suitable interval of time to drain off any previous charges from earlier cycles, and then the output diode periodically receives charge from the last transfer cell of the main charge coupled device section. This received charge is sensed periodically by the gate electrode of a first input IGFET in a preamplifier during periodic time intervals when the drain of this input IGFET is pulsed by a clocked pulse source from ground potential to a reverse bias potential which is well in excess of the IGFET threshold. The drain region of a second IGFET is in common with the source region of the first IGFET. The gate electrode of the second IGFET is connected to the drain region of the first IGFET, and hence this gate electrode is also pulsed simultaneously with the drain of the first IGFET. Thereby, the voltage potential of the source region of this second IGFET goes from a ground potential to a potential representative of the charge on the input gate of the first IGFET and hence representative of charge packet delivered to the output diode region of the main CCD section. Accordingly, since the gate of the first IGFET becomes depleted during this pulsing of both the drain region of the first IGFET and the gate electrode of the second IGFET, the input capacitance for the charge packets on the gate electrode of the first IGFET corresponds to the relatively small depletion layer capacitance of the first IGFET rather than its inversion channel layer capacitance, that is, the capacitance when the inversion layer would be established along the surface of the gate region. The source region of the second IGFET is connected to a flip-flop detector amplifier which is periodically reset to remove the previous voltage state condition of the flip-flop corresponding to the previous charge packet. The flip-flop amplifier also is supplied with a latching pulse immediately after the termination of the voltage pulse to the source of the first input IGFET of the preamplifier, thereby holding the information for utilization by a buffer amplifier and line driver for feeding the output to the same or a different main CCD section. All the while a second terminal of the flip-flop amplifier is being fed a voltage signal a similar preamplifier connected to the output diode region of an auxiliary single transfer stage charge coupled device section which has an output of unilevel charge packet content midway between the binary levels of the main charge coupled device section. The preamplifiers advantageously are connected to form a balanced preamplifier feeding a balanced flip-flop amplifier. Thereby, during each latch pulsed to the flip-flop amplifier, the flip-flop amplifier will be in a state with one of its terminals at essentially ground potential and the other of its terminals at a moderate potential above ground, typically of about 3 to 10 volts, or vice versa, depending upon whether the binary level charge packet content being sensed was above or below the unilevel charge packet content. The condition of the flip-flop is then sampled by a suitably gated buffer amplifier and line driver for utilization by either the same or a different main charge coupled device section for further shift register type circulation, depending upon the organization of the system containing the charge coupled device sections, as known in the art. Advantageously, the buffer amplifier and the flip-flop amplifier are gated periodically such that they are mutually isolated from each other whenever the flip-flop is being latched onto the output of the preamplifier. Thereby improved flip-flop sensitivity is improved.

Since there is but a single transfer stage required in the auxiliary CCD section associated with each main CCD section, as compared to the usual of the order of a hundred transfer stages in the main CCD section, relatively little semiconductor substrate area is occupied by this auxiliary CCD section. This saving of substrate area is all the more important where a plurality of main CCD sections are integrated in a single substrate, each of these main CCD sections being associated with a different balanced regenerative amplifier which is electrically fed by an auxiliary CCD section in accordance with the invention.

BRIEF DESCRIPTION OF DRAWINGS

This invention, together with its features, advantages and objects, may be better understood from the following detailed description when read in conjunction with the drawings in which:

In FIG. 3, a three-phase clock voltage cycle is illustrated, showing a first clock phase line $\psi_1$ turning "on" an N-channel semiconductor IGFET during the time interval $P_1$, $\psi_2$ during $P_2$, and $\psi_3$ during $P_3$. All clocks have the same voltage pulse height $V_P$. In FIG. 1, the input terminals labeled $P_1$, $P_2$, $P_3$ denote terminals to which $\psi_1$, $\psi_2$, $\psi_3$, respectively, are connected. Moreover input terminals labeled for example $P_3P_2$ signify a terminal to which is applied voltage pulse source supplying pulses of height $V_P$ within the time interval $P_3$ but excluding any overlap in time with the time interval $P_2$. Likewise, the time interval $P_2\bar{P}_1\bar{P}_3$ signifies a terminal to which is applied a pulse also of height $V_P$, which is applied within time interval within $P_2$ but excluding any time overlap with $P_1$ and also excluding any overlap with $P_3$.

DETAILED DESCRIPTION

Figure 1:
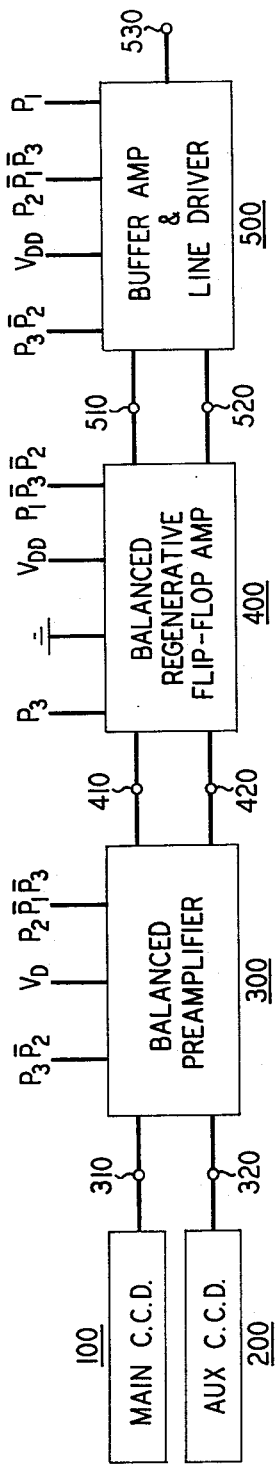
FIG. 1 is a block schematic diagram of a balanced regenerative detection network for a charge coupled device in accordance with the invention.

As shown in FIG. 1, the output diode region of a main semiconductor charge coupled device section 100 feeds a balanced preamplifier 300 at its input terminal 310, the balanced preamplifier being periodically preset during $P_3\bar{P}_2$ by discharge to a reference voltage $V_D$. Amplification of the charge packets in the preamplifier 300 fed by the main CCD section 100 takes place during the gated sample time intervals $P_2\bar{P}_1\bar{P}_3$. The preamplified output of the balanced preamplifier 300 is fed during these intervals, $P_2\bar{P}_1\bar{P}_3$, to an input terminal 410 of a balanced regenerative flip-flop amplifier 400 containing a flip-flop detector. At the same time that the main CCD section 100 is feeding the balanced preamplifier 300 at its input terminal 310, the output diode region of an auxiliary charge coupled device section 200 feeds another input terminal 320 of the balanced preamplifier 300. The charge packets coming from the main CCD section 100 form a binary digital stream of information bits, that is, charge packets of content approximately $Q_1$ or $Q_0$ depending upon whether, respectively, a digital 1 or a digital 0 is then being delivered as output from the main CCD section 100. On the other hand, the auxiliary charge coupled device 200 delivers a stream of charge packets equal to a level midway between the charge content of the packets $Q_0$ or $Q_1$ coming from the main device 100, that is the charge content of the packets being delivered by the auxiliary charge transfer device 200 is arranged to be at least approximately equal to $(Q_0 + Q_1)/2$. Thus, each charge packet injected into the auxiliary CCD section is just midway (digital ½) in charge content between a binary digital 0 and a binary digital 1 being injected into the main CCD section of otherwise similar geometry as the auxiliary CCD section. These digital ½ charge packets are likewise amplified by the balanced preamplifier in the same way as the binary level charge $Q_0$ or $Q_1$ is being amplified therein. Thereby, the balanced preamplifier 300 produces an output at terminals 410 and 420 representative respectively of the stream of binary packets ($Q_0$ and/or $Q_1$) in the main CCD section 100 and the stream of unilevel digital ½ charge packets of the auxiliary CCD section 200. A balanced regenerative amplifier containing a flip-flop, is controlled by a clock pulse $P_3$ for latching the flip-flop. This flip-flop, accordingly, during every latch pulse $P_3$ will be in one of two states, one state representing the case where the binary charge in the output diode of the main CCD section 100 was greater than the digital ½ charge in the output diode of the auxiliary device 200, and the other state corresponding to the case where the "binary" charge stemming from the main CCD section 100 was less than that stemming from the auxiliary CCD section 200. That is to say, the state of the flip-flop will be such that one of its node terminals is essentially at ground potential and the other of its node terminals is at a substantially different potential, typically of 3 to 10 volts, the selection of which node is essentially at ground depending upon whether the binary level in the main CCD section 100 was a digital 1 or a digital 0, that is, whether the binary packet in the output diode of the main CCD section 100 was above or below the digital ½ charge packet supplied by the auxiliary CCD section 200. These nodes of the flip-flop are subsequently reset by $P_1\bar{P}_3\bar{P}_2$. A buffer amplifier and line driver 500 is gated with a clock pulse $\bar{P}_3\bar{P}_2$ so as to sample the voltage state of the flip-flop at terminals 510 and 520 at a time when the flip-flop state is being latched by the pulse $P_3$. The buffer amplifier delivers an output signal at output terminal during time interval $P_1$, which is a binary but amplified voltage representative of the charge packets coming from the main device 100. The buffer amplifier 500 is pre-charged every cycle by a pulse $P_2\bar{P}_1\bar{P}_3$ so as to be reset for detecting and amplifying subsequent states of the flip-flop representing the charge packet streams in the auxiliary CCD section 200 and the main CCD section 100.

Figure 2:
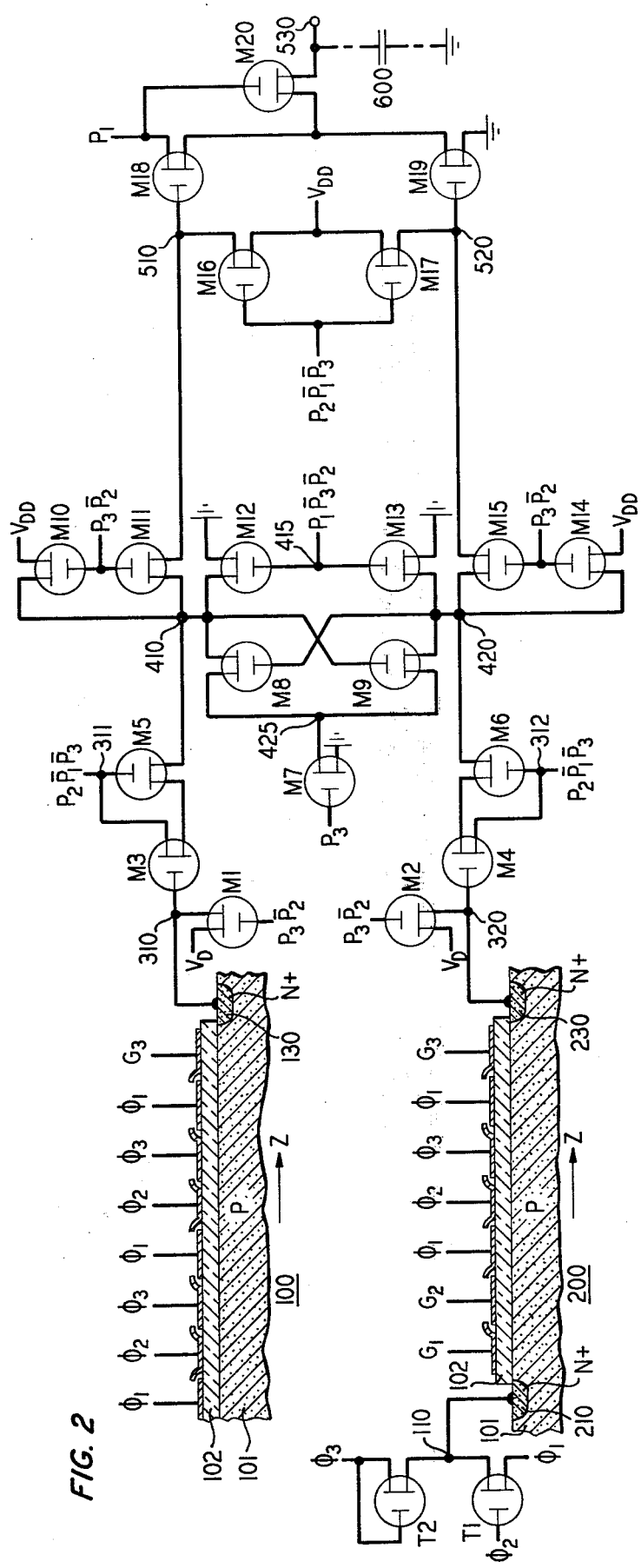
FIG. 2 is a diagram of a charge regenerative network for a charge coupled device in accordance with a specific embodiment of the invention.
Figure 3:
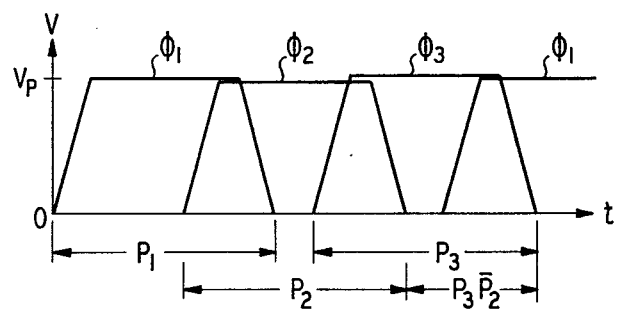
FIG. 3 is a plot of voltage-versus-time of the clock pulse source lines driving the charge coupled device shown in FIG. 2.

As shown in FIG. 2, the main CCD section 100 is built on a P-type semiconductor substrate 101, upon a major surface of which is located an electrically insulating silicon dioxide layer 102, typically about 1,000 Angstroms thick. The P-type substrate 101 is typically of uniform electrical conductivity, as provided by a doping level of about $4 \times 10^{15}$ net significant acceptor impurities per cubic centimeter, such as boron. For the purpose of clarity, only the last two complete three-phase transfer stages are shown, together with electrodes controlled by the clock pulse voltages $\psi_1$, $\psi_2$ and $\psi_3$. Typically, the voltage pulse height of $\psi_1$, $\psi_2$, and $\psi_3$ are in the range from about 10 to 17 volts, at a clock frequency in the range of from 100 KHz to about 10 MHz. The substrate temperature is typically that of the ambient room temperature or somewhat higher during operation. An output diode region 130 in the substrate 101 is of $N^+$ (strongly N) type electrical conductivity, owing to a doping level of the order of $10^{19}$ net significant impurity donors per cubic centimeters, such as phosphorus. This diode region 130 provides an output terminal for the main CCD section 100. The main CCD section 100 is fed an input of binary digital charge packets at an input region located typically of the order of 100 or so transfer stages downstream (not shown for purposes of clarity).

Alongside and in close proximity to the main transfer device section 100, and integrated in the same silicon substrate 101, is located an auxiliary transfer device section 200. The auxiliary section 200 has only a single complete transfer stage controlled by $\psi_1$, $\psi_2$, $\psi_3$. An input diode region 210 and an output diode region 230 are both doped to a level of about $10^{19}$ donors per cubic centimeter, similarily as the output diode region 130 of the main section 100. The input diode region 210 is periodically pulsed with charges at low voltage supplied at terminal 110 between a pair of IGFETs T1 and T2. The source region of T1 is pulsed with $\psi_1$, the gate region of T1 is pulsed with $\psi_2$, and the gate and drain regions of T2 are both pulsed with $\psi_3$. Thereby, during the pulse $\psi_2$, when T1 is therefore "on", negative charges are injected from the then grounded clock source $\psi_1$ through the gate region of the transistor T1 to the terminal 110. These charges are thus at essentially the ground potential then persisting at the clock $\psi_1$. By reason of the selection of the voltages applied to a pair of input gate electrodes $G_1$ and $G_2$, which are the first overlying electrodes to be encountered by the charges in the input diode region 210, the charge packets which are injected from the input diode 210 to the single transfer stage of the auxiliary CCD section 200 are arranged to be substantially equal to midway between the binary digital 0 and binary digital 1 levels of charge packets in the main transfer device 100 arriving at the output diode 130. For example, the voltage on the gate electrode provided by a D.C. source $G_1$ is typically about 5.2 volts and the voltage on the gate electrode provided by a D.C. source $G_2$ is typically about 7.5 volts. More generally, the voltage on the gate $G_1$ is advantageously equal to about $(V_1 + V_0)/2$ where $V_1$ and $V_0$ are the voltages applied to a similarly situated input electrode (not shown) for the main CCD section 100 corresponding to the binary 1 and 0 digital charge packets, respectively. The last gate electrodes on both the main CCD section 100 and the auxiliary CCD section 200 are set by a D.C. gate voltage source $G_3$ at about a voltage of 3.5 volts typically. In this way, with the corresponding electrodes in the auxiliary and main transfer sections all having the same geometry, the charge packets being fed to the output diode 230 will be midway between a binary digital 0 level and a binary digital 1 level of the charge packets being fed into the output diode 130 of the main transfer device. As explained in more detail in my copending patent application, Ser. No. 498,052 filed on Aug. 16, 1974, the first four transfer electrodes (controlled by $G_1$, $G_2$, $\psi_1$, $\psi_2$) on the input side of the CCD sections 100 and 200 are advantageously about twice as long in the Z direction, along which the charge packets propagate, than the other transfer electrodes of mutually equal lengths in these CCD sections. In any event, the relative size of the charge packets in the auxiliary CCD 200 can be controlled by the adjustment of the voltage applied to the gate electrode by the source $G_2$. Alternatively, the electrodes widths perpendicular to the Z direction in the auxiliary CCD section 200 can be made smaller than in the main CCD section 100, thereby providing alternative or further control over the desired ½ size of charge packets being delivered to the output diode 230 of the auxiliary section 200. Typically, the lengths in the Z direction of the auxiliary and the main sections are in the range of about 5 or 10 to 20 microns, typically about 16 microns, as are their widths (except for the first four input electrodes of double lengths).

The balanced detection of the output charge packets arriving at the diodes 130 and 230 is achieved by comparing the respective output signal charges as indicated in the remainder of the electrical network shown in FIG. 2.

The IGFETs M1, M3 and M5 form a first gated preamplifier, and the IGFETs M2, M4 and M6 form a second gated preamplifier, the first and second preamplifiers forming the balanced preamplifier 300 (FIG. 1). The IGFETs M8, M9, M10, M12, M13 and M14 form the balanced regenerative flip-flop detector amplifier 400 of FIG. 1. The IGFETs M11, M15, M16, M17, M18, M19 and M20 form the buffer amplifier and line driver 500 of FIG. 1. The capacitor 600 represents the output capacitive load being driven by the buffer amplifier.

The transistor labelled T and M are all advantageously IGFET types integrated in the same semiconductor substrate 101. The ratios (Z/L) of the channel lengths between source and drain to these channel widths of the IGFET transistors M1 and M2 is typically about 1:1; for the transistors M3, M4, M5, M6, and M7, Z/L is typically about 3:1, for M8 and M9, Z/L is typically about 2:1, for the transistors M10 and M14, Z/L is typically about 1:10; for the transistors M11 and M15, Z/L is typically about 2.5:1; for M12 and M13, Z/L is typically about 2.5:1; for M16 and M17, Z/L is typically about 10:1, and for the transistors M18, M19, and M20, Z/L is typically about 30:1. The applied D.C. voltage $V_{DD}$ for the flip-flop amplifier 400 and for the buffer amplifier 500 is typically about 15 volts (the same as $V_P$), whereas the applied D.C. voltage $V_D$ for the preamplifier 300 is typically about 7.5 volts.

Nodes 310 and 320 of a balanced preamplifier formed by transistors M3, M4, M5, and M6 are preset by the pulse during time slot $P_3\overline{P}_2$ applied to both IGFETs M1 and M2 to the reference voltage $V_D$. In order to enhance the speed of presetting the nodes 310 and 320 and to avoid any threshold voltage drops, the transistors M1 and M2 are both operated in the triode mode, that is to say, in which the drain voltage is less (for N-channel IGFET) than the gate voltage by at least one threshold, so that the source and drain are at the same voltage, as opposed to "saturation" where the current does not increase with increasing drain voltage while the source is at the potential of the gate less a threshold. Thus, during the pulse in the time slot $P_3P_2$ to the transistor M1 and M2, the nodes 310 and 320 are brought to the potential $V_D$ (that is, without suffering any voltage drops in these transistors M1 and M2). Thereby, the effects of extraneous spurious sources of imbalance at the nodes 310 and 320 are reduced. On the other hand, the nodes 410 and 420, associated with the flip-flop detector provided by IGFETs M8, M9, M12, and M13 are preset to ground potential by reason of the pulse during $P_1\overline{P}_2\overline{P}_3$ applied at the common gate terminal 415 of IGFETs M12 and M13.

During operation, when $\psi_1$ drops to ground at the end of interval $P_1$, the output signal charge packet of the main CCD section 100 and the balancing ½ charge packet of the auxiliary CCD section 200 are collected by the respective output diode regions 130 and 230. As more fully described below, the sampling pulse during $P_2\overline{P}_1\overline{P}_3$ applied to the gates of both M5 and M6 as well as to the drains of M3 and M4 brings the potentials of the nodes 410 and 420 to respective binary and uni-level values in accordance with the respective charges in the output diode regions 130 and 230, respectively. As more fully explained below also, the transistors M3 and M4 at this moment of time go into "saturation", that is, with no inversion channel under their gate electrodes. Therefore, the effective input capacitances to the preamplifier 300 presented by the nodes 310 and 320 are both considerably less than the gate capacitance of transistors M3 and M4 otherwise presented in the presence of inversion channels under their gate electrodes. For example, the total effective input capacitance to the preamplifier associated with node 310 is the sum of the storage capacity of output diode region 130 and the capacitance of the gate electrode over the intermediate field oxide of the transistor $M_3$ and the depletion layer capacitance (but not the channel layer capacitance) under the gate electrode of the transistor M3. Moreover, due to the capacitive type loading at node 425, the resulting voltage difference between nodes 410 and 420 of the flip-flop at the end of time slot $P_2P_1P_3$ is significantly more than the voltage difference than between nodes 310 and 320 of the preamplifier. Also, during the time interval $P_2\overline{P}_1\overline{P}_3$, the nodes 510 and 520 of the buffer amplifier are both precharged to the voltage $V_{DD}$ through the transistors M16 and M17.

During the $P_3$ time interval the sampling pulse previously being applied during $P_2P_1P_3$ had dropped to ground, thereby turning "off" the preamplifier transistors M5 and M6 as well as electrically isolating the nodes 410 and 420 of the flip-flop from the nodes 310 and 320 of the preamplifier. As the transistor M7 at the beginning of $P_3$ is turned "on" by $\psi_3$, the potential of node 425 drops to ground and the flip-flop nodes 410 and 420 latch up. In particular, the voltage potential in the flip-flop of that node 410 or 420 which is of lower initial value drops essentially to ground, that is, to ground potential within a volt or less as determined by the time constant of the latch-up process of the flip-flop; while the potential of the other node 420 or 410 decreases only slightly.

When the buffer sampling pulse during $p_3\overline{P}_2$ is subsequently applied to the gates of M10, M11, M14, and M15, the transistors M10 and M14 in particular are thus turned "on", thereby locking and refreshing the flip-flop state. Simultaneously, the buffer sampling transistors M11 and M15 are also turned "on", thereby transmitting the flip-flop state to the buffer nodes 510 and 520. These buffer nodes 510 and 520 were previously precharged by the pulse during $P_2\overline{P}_1\overline{P}_3$ applied to the gate of transistors M16 and M17. Consequently, when the sampling transistors M11 and M15 are thus turned "on", that buffer node 510 or 420 which is connected to the flip-flop node 410 or 420 then at a potential closest to ground thereby discharges to ground, while the other buffer node shares its charge with the other flip-flop node. Since the transistors M10 and M14 have relatively low ratios of channel width to length (Z/L), these transistors have a relatively large internal resistance as compared with transistors M7, M8, and M9, and therefore M10 and M14 do not immediately bring to $V_{DD}$ the potential of the flip-flop nodes 410 and 420; so that the buffer amplifier nodes 510 and 520 are indeed fed the flip-flop state rather than $V_{DD}$. At the end of time slot $P_3\overline{P}_2$, when the associated pulse drops to ground and hence the gate electrodes of M11 and M15 are likewise grounded, the buffer nodes 510 and 520 are isolated from the buffer nodes 410 and 420. Moreover, during the time slot $P_3\overline{P}_2$, the preamplifier nodes 310 and 320 are preset to the reference voltage $V_D$ for the next cycle by reason of the turning "on" of transistors M1 and M2.

During the immediately subsequent time slot $P_1$, a pulse is applied to the gate of transistor M20, thereby turning this transistor "on". Moreover, during this time slot $P_1$, if the buffer node 510 was at the beginning of this time slot at a higher potential than the buffer node 520, then the transistor M18 will simultaneously also be "on", so that the output terminal 530 of the buffer amplifier and line driver will be charged to a high voltage. The speed of charging the output terminal 530 to this high voltage is enhanced by reason of the relatively large channel capacitance of the transistor M18. If, when the transistor M20 turns "on" at the beginning of $P_1$, the node 520 is at a higher potential than the node 510, then the transistor M19 turns "on" thereby bringing the output terminal 530 to ground potential. Thus, the output terminal 530 is brought to the relatively high potential of $V_{DD}$ for representing a signal charge packet in the output diode 130 which is less than the digital ½ charge packet in the output diode 230, that is, a binary digital 0 in the output of the main CCD section; whereas the output terminal 530 is brought to ground potential for representing a signal charge packet in the output of the main CCD section which is greater than the ½ charge packet in the output of the auxiliary CCD section, that is a binary digital 1 in the output of the main CCD section. Following this response of the output terminal 530, during the time slot $P_1\overline{P}_3\overline{P}_2$ a pulse is applied to the terminal 415 between the gate of M12 and M13. Thereby the nodes 410 and 420 of the flip-flop are preset to ground potential by reason of the turning "on" of transistors M12 and M13, thereby resetting the flip-flop for the next cycle.

Figure 4:
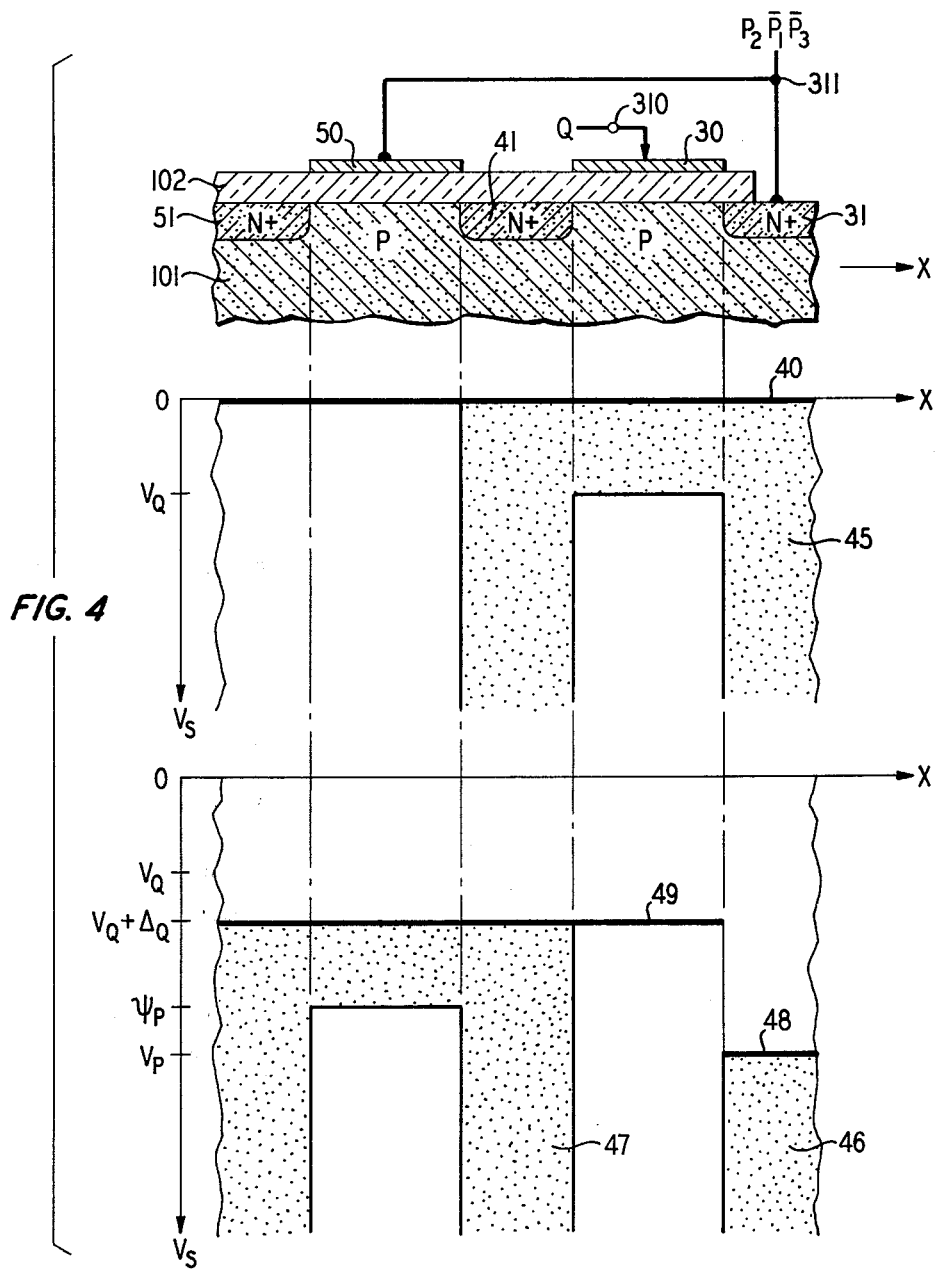
FIG. 4 is a cross-section diagram of a semiconductor preamplifier, together with a plot of its surface potential profile, useful in the network shown in FIG. 2.

In order to understand the operation in greater detail of the preamplifier 300, FIG. 4 illustrates in cross section the semiconductor region of one branch of the preamplifier shown in FIG. 2 formed by the transistors M3 and M5. The semiconductor substrate 101 and the oxide layer 102 shown in FIG. 4 are advantageously extensions of the same semiconductor substrate 101 and oxide layer 102 of FIG. 2. The transistor M3 is formed by a gate electrode 30 overlying a channel region of the substrate 101 located between an N$^+$ conductivity type drain region 31 and an N$^+$ source region 41. The N$^+$ region 41 also serves as the drain region of the transistor M5 associated with the overlying gate electrode 50 and an N$^+$ source region 51. The gate electrode 50 and the drain region 31 are connected to a common terminal 311 which is the same common terminal as 312 to which $P_2\overline{P}_1\overline{P}_3$ is applied. During all times outside the interval $P_2\overline{P}_1\overline{P}_3$, the gate electrode 50 and the drain region 31 are thereby connected to ground. When the pulse during $P_1$ associated with the clock $\psi_1$ turns "off", charge packets in the main CCD section 100 flow into the output diode region 130. At this time the transistor M1 is "off", so that some of this charge Q is shared with the gate electrode 30. At this time, and before the pulse at terminal 311 during $P_2\overline{P}_1\overline{P}_3$ comes "on", the surface potential of the semiconductor extending all the way from the drain region 31 of M3 to the source region 51 of M5 will be at ground potential, as indicated by solid heavy line 40 (FIG. 4). Consequently, as indicated by the stipled regions 45, surface charges in the form of electrons will be present as indicated at the surface of the semiconductor at this time. In particular the level of charge under the gate electrode 30 will correspond to a surface potential $V_S$ given by the difference of $V_S = V_Q$ and ground, that is, a surface potential $V_Q$ depending upon the amount of charge then on the gate electrode 30. Thereafter, when the positive-going pulse during $P_2\overline{P}_1\overline{P}_3$ is applied at terminal 311, the semiconductor surface region under the gate electrode 30 becomes depleted of charges, whereas the surface charges in the drain region 31 will reach a value 48 corresponding to the potential $V_P$ of the said pulse, as indicated by the stipled region 46. Moreover, as indicated by the stipled region 47, the surface potential in the source region 51, as well as under the gate electrode 50 and in the common source-drain region 41, and under the gate electrode 30, will all reach a voltage level 49 corresponding to a surface potential of $V_Q + \alpha_Q$. The value of $\alpha_Q$ represents surface potential different from $V_Q$ due to a shifting of some of the charge Q initially on the gate electrode 30 back to the output diode region 130 due to the decrease in capacitance under the gate electrode 30 associated with a depletion layer thereby produced under this gate electrode 30. It should be noted that $\Psi_P$ represents a surface potential level corresponding to the pulse $V_P$ (less the voltage drop across the insulated layer 102), and this $\Psi_P$ determines the amount of charge which will then be under the gate electrode 50. In any event it is seen that during the voltage pulse at terminal 311 in the time slot $P_2\overline{P}_1\overline{P}_3$, the surface potential of the source region 51 of the transistor M5 goes to the value $V_Q + \Delta_Q$ which depends upon the charge initially in the output diode region 130, some of which is then present on the gate electrode 30 corresponding to a capacitance during depletion. This depletion layer capacitance, of course, is relatively smaller than the inversion layer capacitance, thereby providing for a relatively large voltage $V_Q + \Delta_Q$ in the source region 51. This voltage $V_Q + \Delta_Q$ is then detected by the flip-flop amplifier, at node 410 (FIG. 2). Thereby, the preamplifier input node 310 presents a relatively small input capacitance for the sensing of the charge in the output diode region 130, as desired for sensitive detection of relatively small amounts of charges in the output diode region of a semiconductor CCD.

It should be remarked that the transistors M10 and M14, together with their source connections to $V_{DD}$, can be omitted. More specifically, when operating at clock frequencies of the order of 10 MHz or more, there is insufficient time for these transistors M10 and M14 to function, so that they are then superfluous; but when operating at clock frequencies of the order of 1 MHz or less, these transistors M10 and M14 serve a useful, although not essential, function.

It should also be noted that the auxiliary CCD section 200 contains but a single charge transfer stage associated with the electrodes controlled by $\psi_1$, $\psi_2$, and $\psi_3$, plus input and output stages associated with the electrodes controlled by $G_1$, $G_2$ and $\psi_1$, $G_3$ respectively. A few more transfer stages between these input and output electrodes could be added but are not essential. In any event, the use of the digital ½ level charge packets enables the use of an auxiliary CCD section of but one or a few transfer stages, thereby economizing on substrate area occupied by the regenerative amplifier.

The depletion layer capacitance of the input IGFET of the preamplifier can be reduced further by means of a substrate bias voltage and/or by using a lower level of substrate impurity doping at least in the gate region of the IGFET, thereby increasing the voltage output swing of the preamplifier in response to the different charge packets.

While this invention has been described in terms of a specific embodiment, various modifications can be made without departing from the scope thereof. For example, instead of N-channel, P-channel CCD sections can be used. Moreover, other semiconductor substrates such as germanium or gallium arsenide, in conjunction with other insulator layers to insulate the electrodes from the substrate, may prove useful in serving as the substrate for semiconductor CCD sections. This invention is also applicable to other forms of charge coupled devices than three-phase single-level electrode devices by suitably arranging and preserving the timing order of sequence of the various time slots in the same order as indicated in the specific embodiment. Moreover, this invention is also useful for detecting in a balanced fashion the outputs of other types of binary charge transfer devices such as bucket brigade devices.

What is claimed is:
1. Semiconductor apparatus which comprises
   a. a main charge transfer device section containing a first plurality of transfer stages for providing an output stream of essentially binary level charge packet bits, each such charge packet arriving at a first output terminal of said main charge transfer device section;
   b. an auxiliary charge transfer device section, containing a second plurality of tranfer stages that is substantially less than the first plurality, for providing an output stream of unilevel charge packet bits to a second output terminal, each and every said unilevel charge packet being substantially midway in charge level between the output levels of the binary charge packet bits;
   c. amplifying means coupled to receive outputs from the first and second output terminals for delivering to a third output terminal a signal stream characterized in that said stream is at a first level corresponding to a charge packet arriving at the first terminal greater than the charge packet arriving simultaneously at the second terminal and is at a second level corresponding to a charge packet arriving at the first terminal less than the charge packet arriving simultaneously at the second terminal; said amplifying means including a flip-flop amplifier fed by a pair of preamplifiers, each said preamplifier having a first insulated gate field effect transistor whose gate electrode is connected to a different one of the first and second output terminals of the said charge transfer device sections.

2. Apparatus according to claim 1 in which the first transistor in each preamplifier has its source region connected to the drain region of a separate second transistor in each preamplifier, and in which the gate electrodes of the second transistors in both preamplifiers are connected together at a common terminal to the drain regions of both first transistors in both preamplifiers.

3. Apparatus according to claim 2 in which the source region of the second transistor in the second preamplifier is connected to a second input terminal of the flip-flop amplifier and in which the source region of the second transistor in the first preamplifier is connected to the first input terminal of the flip-flop amplifier.

4. Apparatus according to claim 3 which further comprises periodically pulsed voltage means applied to the common terminal for periodically enabling the drain regions of the second transistors in the first and second preamplifiers respectively to collect charges from both the gate and the source regions of the respective first transistors in accordance with the respective charge packets then at the first and second output terminals, respectively, of the main and auxiliary charge transfer devices, thereby depleting the gate regions of each said first transistors to a surface potential level in accordance with the said respective charge packets and establishing a voltage potential at each of the source regions of the second transistor in each of the respective preamplifiers in accordance with said respective charge packets.

5. Semiconductor apparatus which comprises
   a. a first semiconductor charge coupled device section of a first plurality of transfer stages for producing an output signal stream of charge packets varying from a minimum level to a maximum level for representing a binary input stream of information;
   b. a second semiconductor charge coupled device section for producing an output signal stream of charge packets each substantially of a level midway between said maximum and minimum levels, said second section being integrated in a single crystal silicon semiconductor substrate containing the first section, said second section containing a second plurality of many fewer transfer stages than that of the first plurality;
   c. flip-flop amplifying means; and
   d. preamplifying means coupled to receive the outputs of the first and second charge coupled device sections for delivering amplified electrical representatives of the outputs of the first and second charge coupled device sections to the flip-flop amplifying means, said preamplifying means comprising a pair of branches each branch having a first and a second insulated gate field effect transistor, the gate electrode of the first transistor in one of the branches being connected to an output diode which receives the output stream of the first charge coupled device section and the gate electrode of the first transistor in the second branch being connected to another output diode which receives the output stream of the second charge coupled device section, and means for periodically electrically isolating the said flip-flop means from the preamplifying means when the flip-flop is being latched periodically, whereby during operation said flip-flop amplifying means senses the difference between the signal stream outputs of the first and second charge coupled device sections such that one output terminal of the flip-flop amplifying means goes to an essentially ground potential in response to the output signals from the first and second charge coupled device sections when the output signal from the first section is greater than that of the second section while another terminal of the flip-flop means simultaneously goes to a voltage potential significantly different from ground, said other output terminal of the flip-flop amplifying means going to essentially ground potential when the signal output of the second section is greater than that of the first section and the one terminal of the flip-flop simultaneously going to a potential significantly different from ground.

6. Apparatus according to claim 5 in which the semiconductor substrate is monocrystalline silicon.

7. Semiconductor apparatus according to claim 5 in which the drain of the second transistor in each branch is connected to the source of the first transistor of that branch, the gate electrode of the second transistor in each branch being connected to the drain of the first transistor of the same branch and the source of the second transistor in each branch being connected to a different input terminal of the flip-flop amplifying means.

8. Semiconductor apparatus according to claim 7 in which the first and second semiconductor charge coupled device sections and the first and second transistors in both branches of the preamplifier are all integrated in a single monocrystalline silicon semiconductor substrate.

* * * * *

UNITED STATES PATENT AND TRADEMARK OFFICE
CERTIFICATE OF CORRECTION

PATENT NO. : 4,007,381
DATED : February 8, 1977
INVENTOR(S) : Amr M. Mohsen

It is certified that error appears in the above-identified patent and that said Letters Patent are hereby corrected as shown below:

Column 7, line 4, before "auxiliary" insert --electrodes in the--; line 54, "$P_3P_2$" should read --$P_3\bar{P}_2$--.
Column 8, line 26, "$P_2P_1P_3$" should read --$P_2\bar{P}_1\bar{P}_3$--;
line 33, "$P_2P_1P_3$" should read --$P_2\bar{P}_1\bar{P}_3$--.
Column 10, line 22, "$\alpha_Q$", both occurrences, should read --$\Delta_Q$--.

Signed and Sealed this

Sixteenth Day of May 1978

[SEAL]

Attest:

RUTH C. MASON
Attesting Officer

LUTRELLE F. PARKER
Acting Commissioner of Patents and Trademarks